(12) United States Patent
Chen et al.

(10) Patent No.: US 10,783,977 B2
(45) Date of Patent: Sep. 22, 2020

(54) SHIFT REGISTER, DRIVING METHOD THEREOF, GATE DRIVING CIRCUIT, DISPLAY PANEL AND DISPLAY DEVICE

(71) Applicants: Hefei BOE Display Technology Co., Ltd., Anhui (CN); BOE TECHNOLOGY GROUP CO., LTD., Beijing (CN)

(72) Inventors: Mo Chen, Beijing (CN); Kai Chen, Beijing (CN); Fei Han, Beijing (CN); Fangqing Li, Beijing (CN); Wangdi Wu, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/551,945

(22) Filed: Aug. 27, 2019

(65) Prior Publication Data

US 2020/0243150 A1    Jul. 30, 2020

(30) Foreign Application Priority Data

Jan. 24, 2019   (CN) .......................... 2019 1 0069180

(51) Int. Cl.
*G11C 19/28*     (2006.01)
*G09G 3/36*      (2006.01)

(52) U.S. Cl.
CPC ........... *G11C 19/28* (2013.01); *G09G 3/3674* (2013.01)

(58) Field of Classification Search
CPC ............................. G11C 19/28; G09G 3/3674
See application file for complete search history.

(56) References Cited

U.S. PATENT DOCUMENTS 10,217,427 B2 *    2/2019   Zhang ..................... G11C 19/28
2014/0355733 A1*  12/2014   Kim ....................... G09G 3/3266
                                                                 377/67

FOREIGN PATENT DOCUMENTS

WO    WO-2017036083 A1 *   3/2017    ........... G06F 3/0416

* cited by examiner

*Primary Examiner* — Michael Pervan
(74) *Attorney, Agent, or Firm* — Calfee, Halter & Griswold LLP

(57) ABSTRACT

A shift register including an input circuit, an output circuit, a first output control circuit, a second output control circuit, a reset circuit, a first reset control circuit, a second reset control circuit, and an energy-storing circuit. The first output control circuit is configured to transfer a clock signal present at a third clock signal terminal to a first node in response to the clock signal at the third clock signal terminal being active. The second output control circuit is configured to transfer a voltage present at a first voltage terminal to the first node in response to a clock signal at a fourth clock signal terminal being active.

14 Claims, 6 Drawing Sheets

SHIFT REGISTER, DRIVING METHOD THEREOF, GATE DRIVING CIRCUIT, DISPLAY PANEL AND DISPLAY DEVICE

CROSS-REFERENCE TO RELATED APPLICATIONS

The present application claims the priority of Chinese Patent Application No. 201910069180.1, filed with the Chinese Patent Office on Jan. 24, 2019, the entire disclosure of which is incorporated herein by reference.

TECHNICAL FIELD

The present disclosure relates to the field of display technologies, and in particular, to a shift register, a driving method thereof, a gate driving circuit, a display panel, and a display device.

BACKGROUND

Gate-driver-on-array (GOA) is a technology where a gate driving circuit is integrated on an array substrate. The GOA circuit includes a plurality of shift registers that are cascaded, each of which is connected to a respective gate line to output a gate scan signal to the gate line. In this way, progressive scanning of a plurality of the gate lines is achieved in a display panel.

In prior art GOA circuits, the transistors in each of the shift registers are susceptible to drift of the threshold voltage, resulting in reduced stability of the GOA circuit. This can be due to the fact that some nodes in the shift register are biased by a voltage for a long period of time.

SUMMARY

According to some exemplary embodiments, a shift register is provided which comprises: a first clock signal terminal, a second clock signal terminal, a third clock signal terminal, a fourth clock signal terminal, a signal input terminal, a signal output terminal, and a first voltage terminal; an input circuit configured to transfer an input signal at the signal input terminal to a first node in response to a clock signal at the first clock signal terminal being active; an output circuit configured to store a voltage across the first node and the signal output terminal, and to transfer a clock signal at the second clock signal terminal to the signal output terminal in response to a potential at the first node being active; a first output control circuit configured to transfer a clock signal at the third clock signal terminal to the first node in response to the clock signal at the third clock signal terminal being active; a second output control circuit configured to transfer a voltage at the first voltage terminal to the first node in response to a clock signal at the fourth clock signal terminal being active; a reset circuit configured to transfer the voltage at the first voltage terminal to the signal output terminal in response to a potential at a second node being active; a first reset control circuit configured to transfer the voltage at the first voltage terminal to the second node in response to the potential at the first node being active; a second reset control circuit configured to transfer the clock signal at the fourth clock signal terminal to the second node in response to the clock signal at the fourth clock signal terminal being active; and an energy-storing circuit configured to store a voltage across the second node and the signal output terminal.

In some exemplary embodiments, the output circuit comprises: a sixth transistor comprising a gate connected to the first node, a first electrode connected to the second clock signal terminal, and a second electrode connected to the signal output terminal; and a first capacitor comprising a first terminal connected to the first node and a second terminal connected to the signal output terminal.

In some exemplary embodiments, the reset circuit comprises a seventh transistor comprising a gate connected to the second node, a first electrode connected to the first voltage terminal, and a second electrode connected to the signal output terminal.

In some exemplary embodiments, the energy-storing circuit comprises a second capacitor comprising a first terminal connected to the second node and a second terminal connected to the signal output terminal.

In some exemplary embodiments, the first output control circuit comprises a third transistor comprising a gate connected to the third clock signal terminal, a first electrode connected to the third clock signal terminal, and a second electrode connected to the first node.

In some exemplary embodiments, the second output control circuit comprises a fifth transistor comprising a gate connected to the fourth clock signal terminal, a first electrode connected to the first voltage terminal, and a second electrode connected to the first node.

In some exemplary embodiments, the first reset control circuit comprises a fourth transistor comprising a gate connected to the first node, a first electrode connected to the first voltage terminal, and a second electrode connected to the second node.

In some exemplary embodiments, the second reset control circuit comprises a second transistor comprising a gate connected to the fourth clock signal terminal, a first electrode connected to the fourth clock signal terminal, and a second electrode connected to the second node.

In some exemplary embodiments, the input circuit comprises a first transistor comprising a gate connected to the first clock signal terminal, a first electrode connected to the signal input terminal, and a second electrode connected to the first node.

According to some exemplary embodiments, a gate driving circuit is provided which comprises N shift registers as described above that are cascaded, N being an integer greater than or equal to 4. The signal input terminal of a first one of the N shift registers is configured to receive a start signal. The signal output terminal of an n-th one of the N shift registers is connected to the signal input terminal of an (n+1)-th one of the N shift registers, n being an integer, $1 \leq n \leq N-1$. The first clock signal terminal of a (4i+1)-th one of the N shift registers, the fourth clock signal terminal of a (4i+2)-th one of the N shift registers, the third clock signal terminal of a (4i+3)-th one of the N shift registers, and the second clock signal terminal of a (4i+4)-th one of the N shift registers are configured to receive a first clock signal, i being an integer, $0 \leq i \leq (N-4)/4$. The second clock signal terminal of the (4i+1)-th one of the N shift registers, the first clock signal terminal of the (4i+2)-th one of the N shift registers, the fourth clock signal terminal of the (4i+3)-th one of the N shift registers, and the third clock signal terminal of the (4i+4)-th one of the N shift registers are configured to receive a second clock signal. The third clock signal terminal of the (4i+1)-th one of the N shift registers, and the second clock signal terminal of the (4i+2)-th one of the N shift registers, the first clock signal terminal of the (4i+3)-th one of the N shift registers, and the fourth clock signal terminal of the (4i+4)-th one of the N shift registers are configured to receive a third clock signal. The fourth clock signal terminal of the (4i+1)-th one of the N shift registers, and the third clock signal terminal of the (4i+2)-th one of the N shift registers, the second clock signal terminal of the (4i+3)-th one of the N shift registers, and the first clock signal terminal of the (4i+4)-th one of the N shift registers are configured to receive a fourth clock signal terminal.

According to some exemplary embodiments, a display panel is provided which comprises the gate drive circuit as described above.

According to some exemplary embodiments, a display device is provided which comprises the display panel as described above.

According to some exemplary embodiments, a method of driving a shift register is provided. The shift register comprises: a first clock signal terminal, a second clock signal terminal, a third clock signal terminal, a fourth clock signal terminal, a signal input terminal, a signal output terminal, and a first voltage terminal; an input circuit configured to transfer an input signal at the signal input terminal to a first node in response to a clock signal at the first clock signal terminal being active; an output circuit configured to store a voltage across the first node and the signal output terminal, and to transfer a clock signal at the second clock signal terminal to the signal output terminal in response to a potential at the first node being active; a first output control circuit configured to transfer a clock signal at the third clock signal terminal to the first node in response to the clock signal at the third clock signal terminal being active; a second output control circuit configured to transfer a voltage at the first voltage terminal to the first node in response to a clock signal at the fourth clock signal terminal being active; a reset circuit configured to transfer the voltage at the first voltage terminal to the signal output terminal in response to a potential at a second node being active; a first reset control circuit configured to transfer the voltage at the first voltage terminal to the second node in response to the potential at the first node being active; a second reset control circuit configured to transfer the clock signal at the fourth clock signal terminal to the second node in response to the clock signal at the fourth clock signal terminal being active; and an energy-storing circuit configured to store a voltage across the second node and the signal output terminal. The method comprises: responsive to the clock signal at the first clock signal terminal being active, transferring by the input circuit the input signal at the signal input terminal to the first node; responsive to the potential at the first node being active, transferring by the output circuit the clock signal at the second clock signal terminal to the signal output terminal, and transferring by the first reset control circuit the voltage at the first voltage terminal to the second node; responsive to the clock signal at the third clock signal terminal being active, transferring by the first output control circuit the clock signal at the third clock signal terminal to the first node; responsive to the clock signal at the fourth clock signal terminal being active, transferring by the second reset control circuit the clock signal at the fourth clock signal terminal to the second node, and transferring by the second output control circuit the voltage at the first voltage terminal to the first node; and responsive to the potential at the second node being active, transferring by the reset circuit the voltage at the first voltage terminal to the signal output terminal.

In some exemplary embodiments, the method further comprises supplying, to the first clock signal terminal, the second clock signal terminal, the third clock signal terminal, and the fourth clock signal terminal, a first clock signal, a second clock signal, a third clock signal, and a fourth clock signal, respectively. The first, second, third, and fourth clock signals each have a period of 4H and a duty ratio of 25%. The first, second, third and fourth clock signals sequentially lag behind by 1H with respect to each other.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
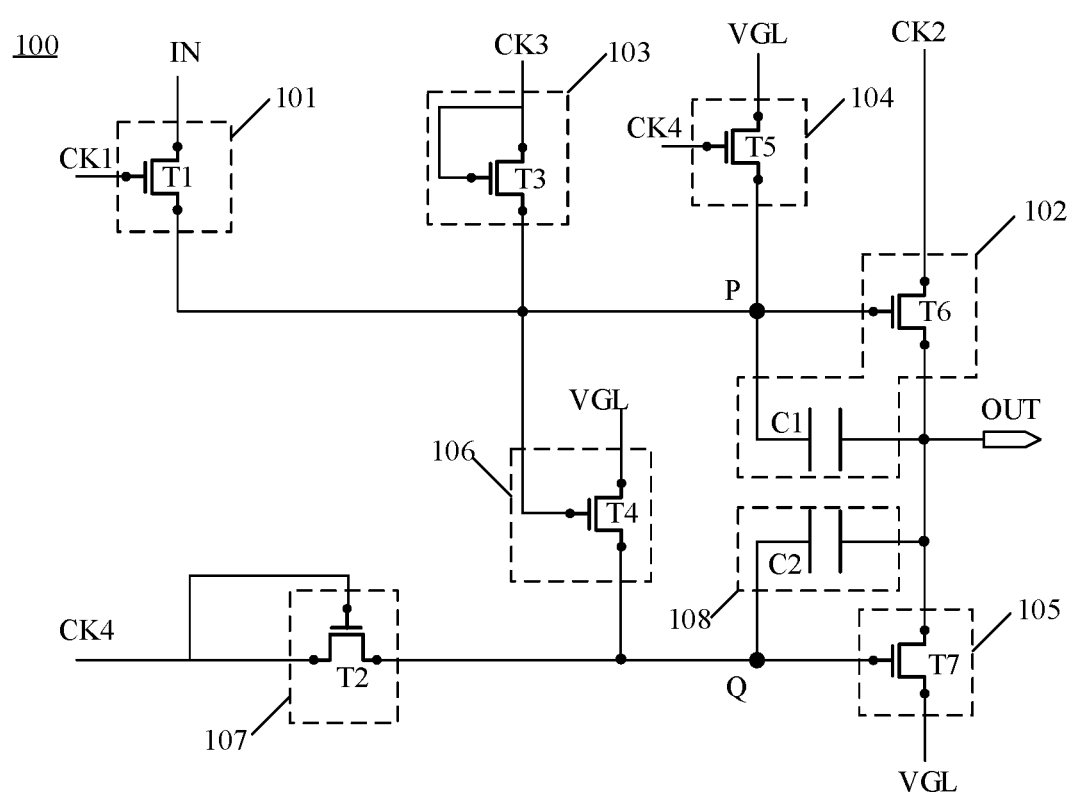
FIG. 1 is a circuit diagram of a shift register in accordance with an exemplary embodiment.

FIG. 1 is a circuit diagram of a shift register 100 in accordance with an exemplary embodiment. As shown in FIG. 1, the shift register 100 includes a first clock signal terminal CK1, a second clock signal terminal CK2, a third clock signal terminal CK3, a fourth clock signal terminal CK4, a signal input terminal IN, a signal output terminal OUT, a first voltage terminal VGL, an input circuit 101, an output circuit 102, a first output control circuit 103, a second output control circuit 104, a reset circuit 105, a first reset control circuit 106, a second reset control circuit 107, and an energy-storing circuit 108.

The input circuit 101 is configured to transfer an input signal at the signal input terminal IN to a first node P in response to a clock signal at the first clock signal terminal CK1 being active.

The output circuit 102 is configured to store a voltage across the first node P and the signal output terminal OUT. The output circuit 102 is further configured to transfer a clock signal at the second clock signal terminal CK2 to the signal output terminal OUT in response to a potential at the first node P being active.

The first output control circuit 103 is configured to transfer a clock signal at the third clock signal terminal CK3 to the first node P in response to the clock signal at the third clock signal terminal CK3 being active.

The second output control circuit 104 is configured to transfer a voltage at the first voltage terminal VGL to the first node in response to the clock signal at the fourth clock signal terminal CK4 being active.

The reset circuit 105 is configured to transfer the voltage at the first voltage terminal VGL to the signal output terminal OUT in response to a potential at a second node Q being active.

The first reset control circuit 106 is configured to transfer the voltage at the first voltage terminal VGL to the second node Q in response to the potential at the first node P being active.

The second reset control circuit 107 is configured to transfer the clock signal at the fourth clock signal terminal CK4 to the second node Q in response to the clock signal at the fourth clock signal terminal CK4 being active.

The energy-storing circuit 108 is configured to store a voltage across the second node Q and the signal output terminal OUT.

The phrase "signal being active" or "potential being active" as used herein means that the signal or potential has such a level that the circuit element involved (e.g., a transistor) is enabled. Similarly, the phrase "signal being inactive" or "potential being inactive" as used herein means that the signal or potential has such a level that the circuit element involved is disabled. For an N-type transistor, the active signal or potential has a high level and the inactive signal or potential has a low level. For a P-type transistor, the active signal or potential has a low level and the inactive signal or potential has a high level. It will be understood that a high or low level is not intended to refer to a specific level, but may include a range of levels.

As will be further described later, in the operation of the shift register 100, the potentials at the first node P and the second node Q may periodically switch between an active potential and an inactive potential during a period in which the signal output terminal OUT is at an inactive potential. This causes the transistors controlled by the potentials at the first node P and the second node Q to be periodically turned on and off, alleviating or even eliminating the drift of the threshold voltage of the transistors. This may advantageously improve the reliability of the shift register 100.

In some embodiments, the input circuit 101 includes a first transistor T1. The first transistor T1 includes a gate connected to the first clock signal terminal CK1, a first electrode connected to the signal input terminal IN, and a second electrode connected to the first node P.

In some exemplary embodiments, the output circuit 102 includes a sixth transistor T6 and a first capacitor C1. The sixth transistor T6 includes a gate connected to the first node P, a first electrode connected to the second clock signal terminal CK2, and a second electrode connected to the signal output terminal OUT. The first capacitor C1 includes a first terminal connected to the first node P and a second terminal connected to the signal output terminal OUT.

In some exemplary embodiments, the reset circuit 105 includes a seventh transistor T7. The seventh transistor T7 includes a gate connected to the second node Q, a first electrode connected to the first voltage terminal VGL, and a second electrode connected to the signal output terminal OUT.

In some exemplary embodiments, the energy-storing circuit 108 includes a second capacitor C2. The second capacitor C2 includes a first terminal connected to the second node Q and a second terminal connected to the signal output terminal OUT.

In some exemplary embodiments, the first output control circuit 103 includes a third transistor T3. The third transistor T3 includes a gate connected to the third clock signal terminal CK3, a first electrode connected to the third clock signal terminal CK3, and a second electrode connected to the first node P.

In some exemplary embodiments, the second output control circuit 104 includes a fifth transistor T5. The fifth transistor T5 includes a gate connected to the fourth clock signal terminal CK4, a first electrode connected to the first voltage terminal VGL, and a second electrode connected to the first node P.

In some exemplary embodiments, the first reset control circuit 106 includes a fourth transistor T4. The fourth transistor T4 includes a gate connected to the first node P, a first electrode connected to the first voltage terminal VGL, and a second electrode connected to the second node Q.

In some exemplary embodiments, the second reset control circuit 107 includes a second transistor T2. The second transistor T2 includes a gate connected to the fourth clock signal terminal CK4, a first electrode connected to the fourth clock signal terminal CK4, and a second electrode connected to the second node Q.

Although in exemplary embodiments the transistors are illustrated and described as N-type transistors, P-type transistors are possible. In the case of a P-type transistor, the gate-on voltage has a low level, and the gate-off voltage has a high level. The transistors can take the form of, for example, thin film transistors, which are typically fabricated such that their first and second electrodes are used interchangeably. Other embodiments are also contemplated.

Figure 2:
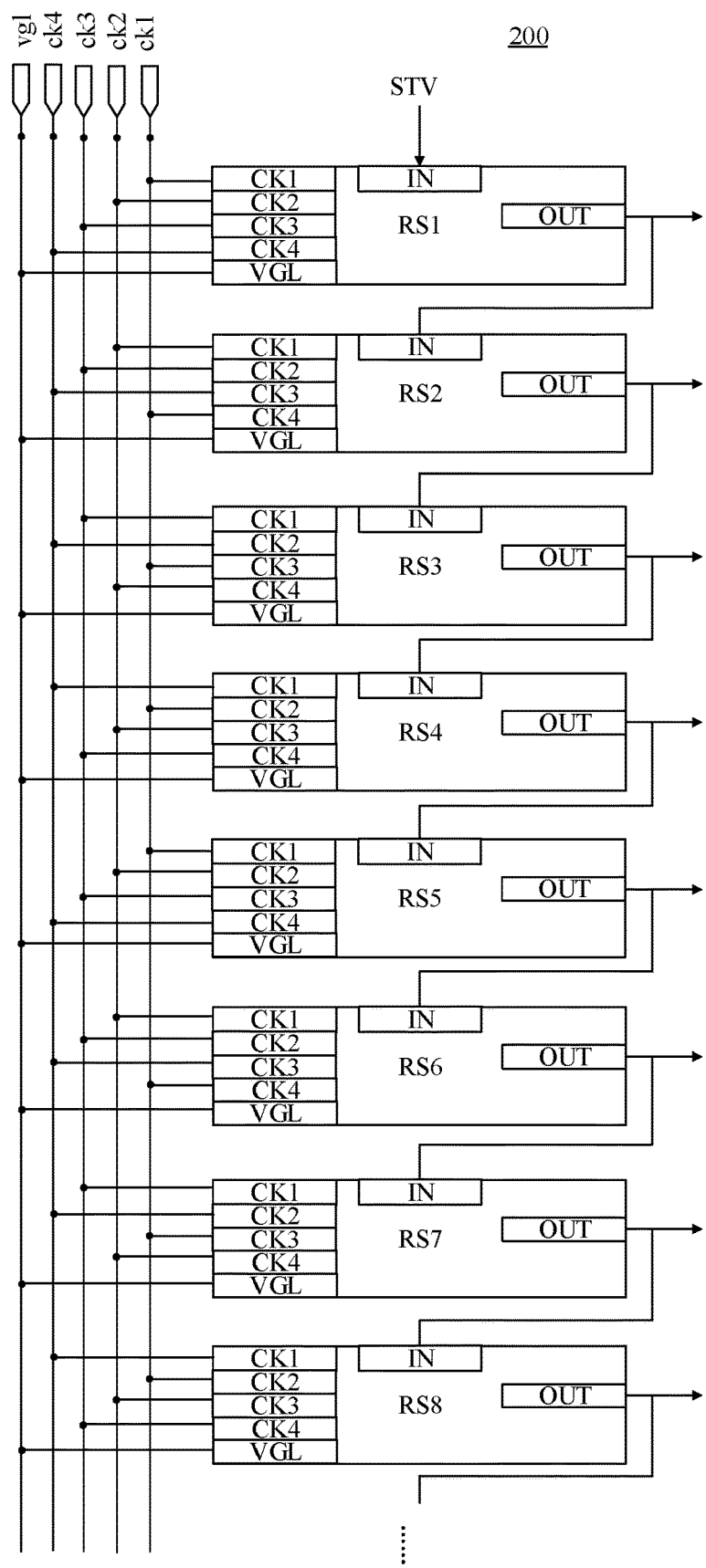
FIG. 2 is a schematic block diagram of a gate driving circuit in accordance with an exemplary embodiment.

FIG. 2 is a schematic block diagram of a gate drive circuit 200 in accordance with an exemplary embodiment. As shown in FIG. 2, the gate driving circuit 200 includes N (N being an integer greater than or equal to 4) shift registers RS that are cascaded, the first 8 of which (i.e., RS1 to RS8) are shown. These shift registers RS can take the form of the shift register 100 described above with respect to FIG. 1.

The first voltage terminal VGL of each of the N shift registers is configured to receive an inactive voltage vgl.

The signal input terminal IN of the first one of the N shift registers is configured to receive a start signal STV. The start signal STV indicates the beginning of a vertical scan period. In the example of FIG. 2, the signal input terminal IN of the shift register RS1 is configured to receive the start signal STV.

The signal output terminal OUT of the n-th one of the N shift registers is connected to the signal input terminal IN of the (n+1)-th one of the N shift registers, n being an integer, 1≤n≤N−1. For example, the signal output terminal OUT of the shift register RS1 is connected to the signal input terminal IN of the shift register RS2, and the signal output terminal OUT of the shift register RS2 is connected to the signal input terminal IN of the shift register RS3, and so on.

The first clock signal terminal CK1 of the (4i+1)-th one of the N shift registers, the fourth clock signal terminal CK4 of the (4i+2)-th one of the N shift registers, the third clock signal terminal CK3 of the (4i+3)-th one of the N shift registers, and the second clock signal terminal CK2 of the (4i+4)-th one of the N shift registers are configured to receive a first clock signal ck1, i being an integer, 0≤i≤(N−4)/4. For example, the first clock signal terminal CK1 of the shift register RS1, the fourth clock signal terminal CK4 of the shift register RS2, the third clock signal terminal CK3 of the shift register RS3, and the second clock signal terminal CK2 of the shift register RS4 are configured to receive the first clock signal ck1.

The second clock signal terminal CK2 of the (4i+1)-th shift register, the first clock signal terminal CK1 of the (4i+2)-th shift register, the fourth clock signal terminal CK4 of the (4i+3)-th shift register, and the third clock signal terminal CK3 of the (4i+4)-th shift register are configured to receive a second clock signal ck2. For example, the second clock signal terminal CK2 of the shift register RS1, the first clock signal terminal CK1 of the shift register RS2, the fourth clock signal terminal CK4 of the shift register RS3, and the third clock signal terminal CK3 of the shift register RS4 are configured to receive the second clock signal ck2.

The third clock signal terminal CK3 of the (4i+1)-th shift register, the second clock signal terminal CK2 of the (4i+2)-th shift register, the first clock signal terminal CK1 of the (4i+3)-th shift register, and the fourth clock signal terminal CK4 of the (4i+4)-th shift register are configured to receive a third clock signal ck3. For example, the third clock signal terminal CK3 of the shift register RS1, the second clock signal terminal CK2 of the shift register RS2, the first clock signal terminal CK1 of the shift register RS3, and the fourth clock signal terminal CK4 of the shift register RS4 are configured to receive the third clock signal ck3.

The fourth clock signal terminal CK4 of the (4i+1)-th shift register, the third clock signal terminal CK3 of the (4i+2)-th shift register, the second clock signal terminal CK2 of the (4i+3)-th shift register, and the first clock signal terminal CK1 of the (4i+4)-th shift register are configured to receive a fourth clock signal ck4. For example, the fourth clock signal terminal CK4 of the shift register RS1, the third clock signal terminal CK3 of the shift register RS2, the second clock signal terminal CK2 of the shift register RS3, and the first clock signal terminal CK1 of the shift register RS4 are configured to receive the fourth clock signal terminal ck4.

Figure 3A:
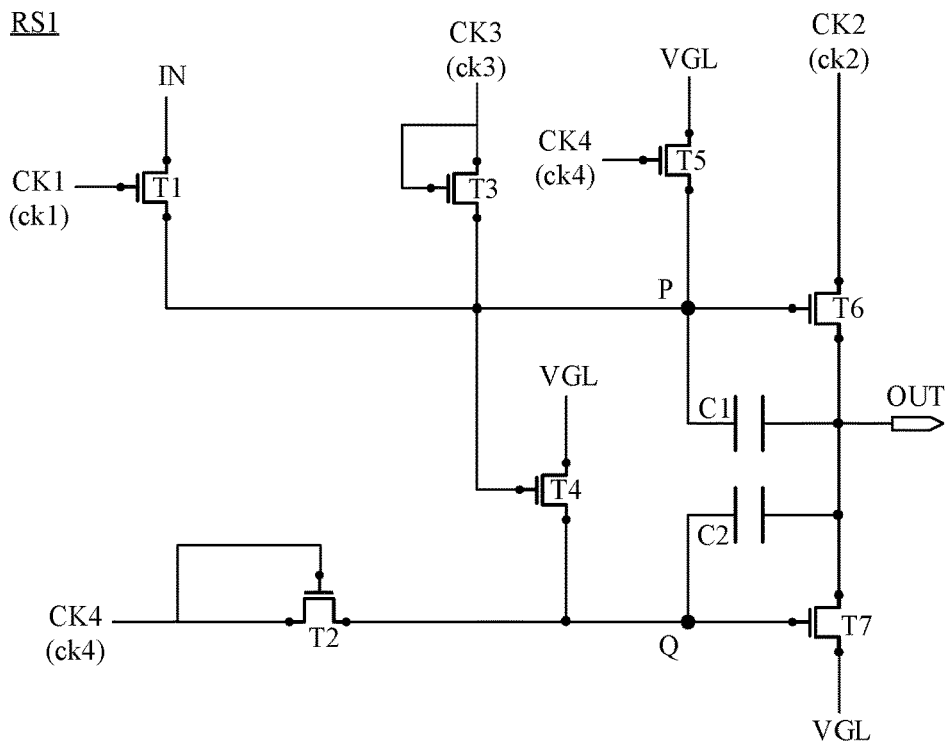
FIG. 3a is a schematic diagram showing that clock signal terminals of a shift register in the gate driving circuit of FIG. 2 are supplied with different clock signals.
Figure 3B:
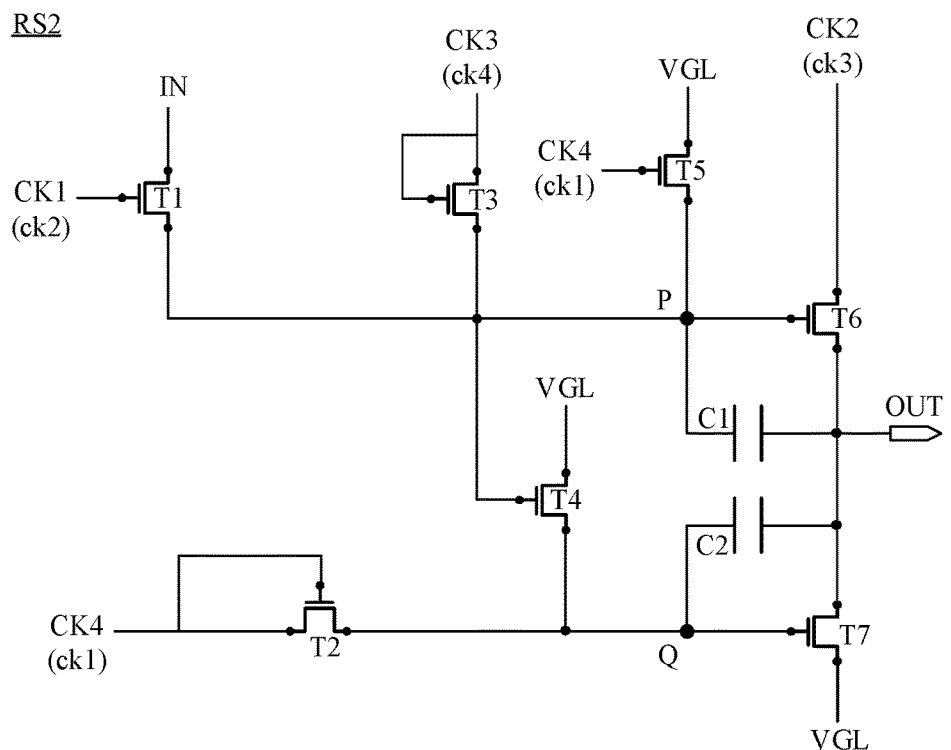
FIG. 3b is a schematic diagram showing that clock signal terminals of a shift register in the gate driving circuit of FIG. 2 are supplied with different clock signals.
Figure 3C:
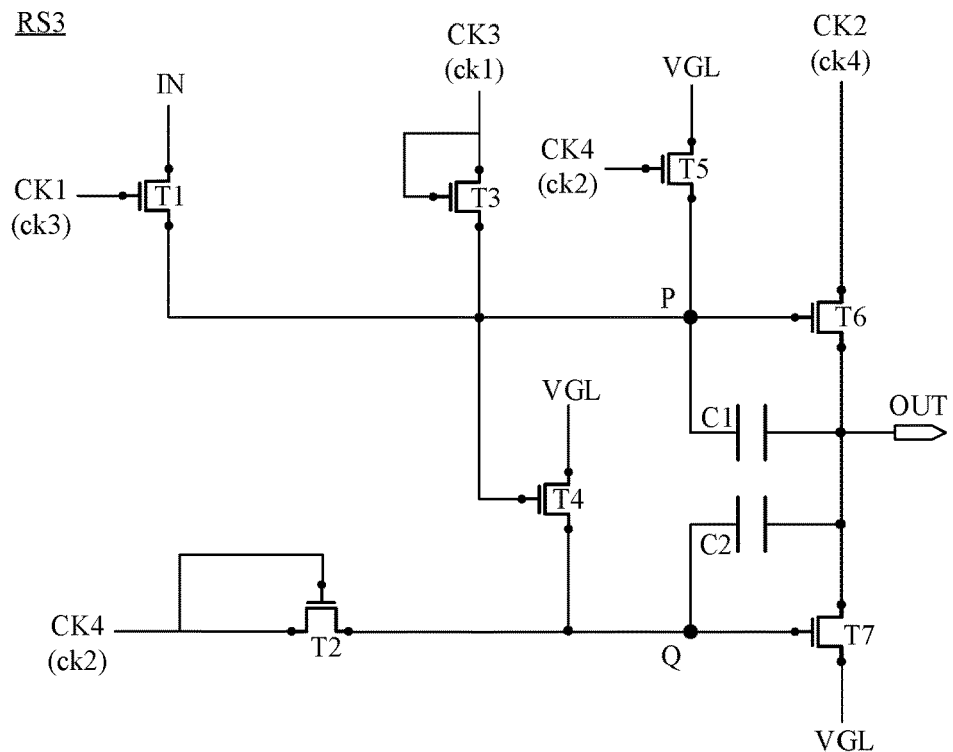
FIG. 3c is a schematic diagram showing that clock signal terminals of a shift register in the gate driving circuit of FIG. 2 are supplied with different clock signals.
Figure 3D:
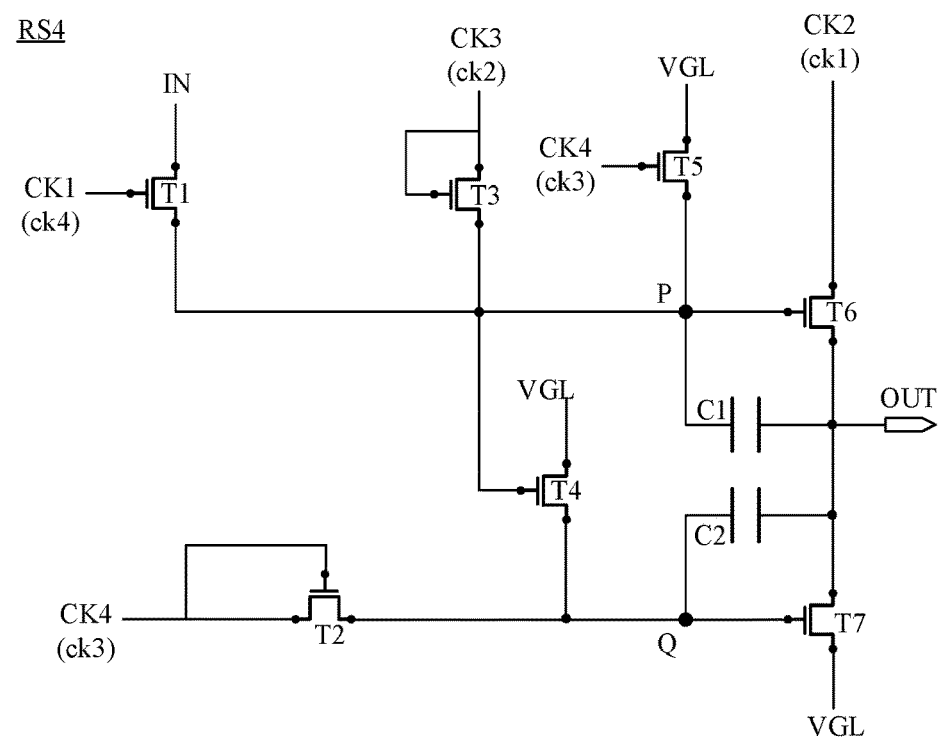
FIG. 3d is a schematic diagram showing that clock signal terminals of a shift register in the gate driving circuit of FIG. 2 are supplied with different clock signals.

FIGS. 3a to 3d respectively show that the clock signal terminals of the shift registers RS1, RS2, RS3, and RS4 are supplied with different clock signals. As shown in FIG. 3a, the clock signal terminals CK1, CK2, CK3, and CK4 of the shift register RS1 receive the clock signals ck1, ck2, ck3, and ck4, respectively. As shown in FIG. 3b, the clock signal terminals CK1, CK2, CK3, and CK4 of the shift register RS2 receive the clock signals ck2, ck3, ck4, and ck1, respectively. As shown in FIG. 3c, the clock signal terminals CK1, CK2, CK3, and CK4 of the shift register RS3 receive the clock signals ck3, ck4, ck1, and ck2, respectively. As shown in FIG. 3d, the clock signal terminals CK1, CK2, CK3, and CK4 of the shift register RS4 receive the clock signals ck4, ck1, ck2, and ck3, respectively.

In some exemplary embodiments, the first clock signal ck1, the second clock signal ck2, the third clock signal ck3, and the fourth clock signal ck4 each have a period of 4H and a duty ratio of 25%, and they sequentially lag behind by 1H with respect to each other, with H being a horizontal scan period. Under the excitation of such clock signals, the shift registers 100 in the gate drive circuit 200 operate to sequentially output a gate scan signal.

The gate driving circuit 200 has the same advantages as the above shift register exemplary embodiments, a detailed description of which will not be repeated herein.

Figure 4:
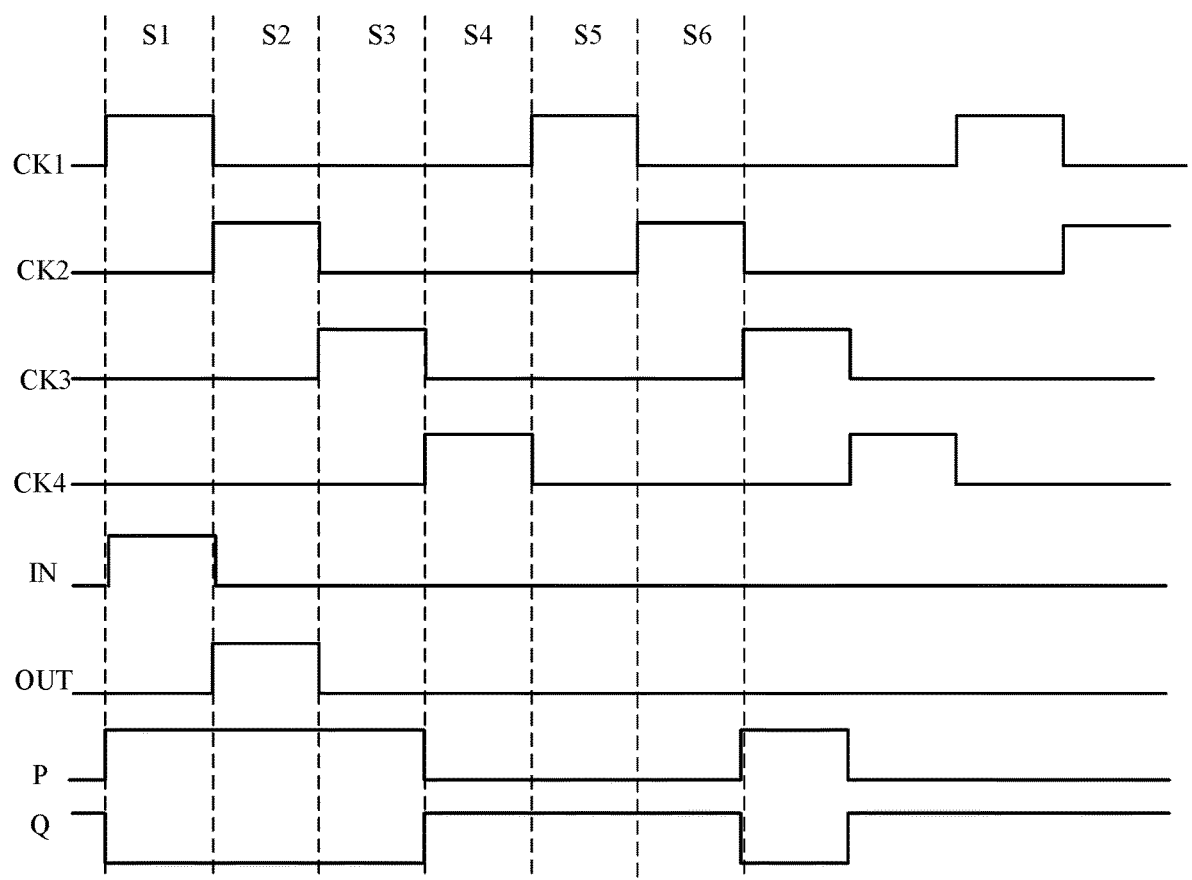
FIG. 4 is a schematic and exemplary timing diagram for a shift register in accordance with an exemplary embodiment.

FIG. 4 is a schematic and exemplary timing diagram for the shift register 100. The operation of the shift register 100 will be described below with reference to FIGS. 1 and 4.

Input Phase S1

The clock signal at the first clock signal terminal CK1 and the input signal at the signal input terminal IN are active. The input circuit 101 transfers the active input signal to the first node P such that the first node P is at an active potential. Under the control of the active potential at the first node P, the output circuit 102 transfers the clock signal at the second clock signal terminal CK2 to the signal output terminal OUT, and the first reset control circuit 106 transfers the inactive voltage at the first voltage terminal VGL to the second node Q such that the second node Q is at an inactive potential.

Specifically, in the input phase S1, the first transistor T1, the fourth transistor T4, and the sixth transistor T6 are turned on, and the second transistor T2, the third transistor T3, the fifth transistor T5, and the seventh transistor T7 are turned off.

Output phase S2 The clock signal at the second clock signal terminal CK2 is active. The output circuit 102 transfers the active clock signal at the second clock signal terminal CK2 to the signal output terminal OUT. The first node P remains at an active potential, and the first reset control circuit 106 transfers the inactive voltage at the first voltage terminal VGL to the second node Q such that the second node Q is still at an active potential.

Specifically, in the output phase S2, the first capacitor C1 maintains the first node P at the active potential, the fourth transistor T4 and the sixth transistor T6 are turned on, and the first transistor T1, the second transistor T2, the third transistor T3, the fifth transistor T5 and the seventh transistor T7 are turned off.

First Reset Phase S3

The clock signal at the third clock signal terminal CK3 is active. The first output control circuit 103 transfers the active clock signal at the third clock signal terminal CK3 to the first node P such that the first node P is still at the active potential. Under the control of the active potential at the first node P, the output circuit 102 transfers the clock signal at the second clock signal terminal CK2 to the signal output terminal OUT, and the first reset control circuit 106 transfers the inactive voltage at the first voltage terminal VGL to the second node Q such that the second node Q is still at an inactive potential.

Specifically, in the first reset phase S3, the third transistor T3, the fourth transistor T4, and the sixth transistor T6 are turned on, and the first transistor T1, the second transistor T2, the fifth transistor T5, and the seventh transistor T7 are turned off.

Second Reset Phase S4

The clock signal at the fourth clock signal terminal CK4 is active. The second reset control circuit 107 transfers the active clock signal at the fourth clock signal terminal CK4 to the second node Q such that the second node Q is at an active potential. Under the control of the active potential at the second node Q, the reset circuit 105 transfers the inactive voltage at the first voltage terminal VGL to the signal output terminal OUT. Further, under the control of the active clock signal at the fourth clock signal terminal CK4, the second output control circuit 104 transfers the inactive voltage at the first voltage terminal VGL to the first node P such that the first node P is at an inactive potential.

Specifically, in the second reset phase S4, the second transistor T2, the fifth transistor T5, and the seventh transistor T7 are turned on, and the first transistor T1, the third transistor T3, the fourth transistor T4, and the sixth transistor T6 are turned off.

Third Reset Phase S5

The clock signal at the first clock signal terminal CK1 is active. The second node Q remains at an active potential. Under the control of the active potential at the second node Q, the reset circuit 105 transfers the inactive voltage at the first voltage terminal VGL to the signal output terminal OUT. Further, under the control of the active clock signal at the first clock signal terminal CK1, the input circuit 101 transfers the input signal (inactive) at the signal input terminal IN to the first node P, so that the first node P is still at the inactive potential.

Specifically, in the third reset phase S5, the second capacitor C2 maintains the second node Q at the active potential, the first transistor T1 and the seventh transistor T7 are turned on, and the second transistor T2, the third transistor T3, and the fourth transistor T4, the fifth transistor T5, and the sixth transistor T6 are turned off.

Fourth Reset Phase S6

The first node P remains at an inactive potential and the second node Q remains at an active potential. Under the control of the active potential at the second node Q, the reset circuit 105 transfers the inactive voltage at the first voltage terminal VGL to the signal output terminal OUT.

Specifically, the first capacitor C1 maintains the first node P at the inactive potential, the second capacitor C2 maintains the second node Q at the active potential, the seventh transistor T7 is turned on, and the first transistor T1, the second transistor T2, and the third transistor T3, the fourth transistor T4, the fifth transistor T5, and the sixth transistor T6 are turned off.

The first reset phase S3, the second reset phase S4, the third reset phase S5, and the fourth reset phase S6 are repeated until the next vertical scan period comes.

As can be seen from FIGS. 1 and 4, after the output phase S2, the potentials at the first node P and the second node Q periodically switch between an active state and an inactive state. This allows the transistors controlled by the potentials at the first node P and the second node Q (more specifically, the fourth transistor T4, the sixth transistor T6, and the seventh transistor T7) to be periodically turned on and off. In addition, since the clock signals at the first, third, and fourth clock signal terminals CK1, CK3 and CK4 also periodically switch between an active state and an inactive state, the transistors controlled by these clock signals (more specifically, the first transistor T1, the three transistors T3, the second transistor T2, and the fifth transistor T5) are also periodically turned on and off. Therefore, all of the transistors in the shift register 100 are periodically turned on and off, instead of being turned on or off for a long period of time. This alleviates or even eliminates the drift of the threshold voltage of the transistor, improving the stability of the shift register.

Figure 5:
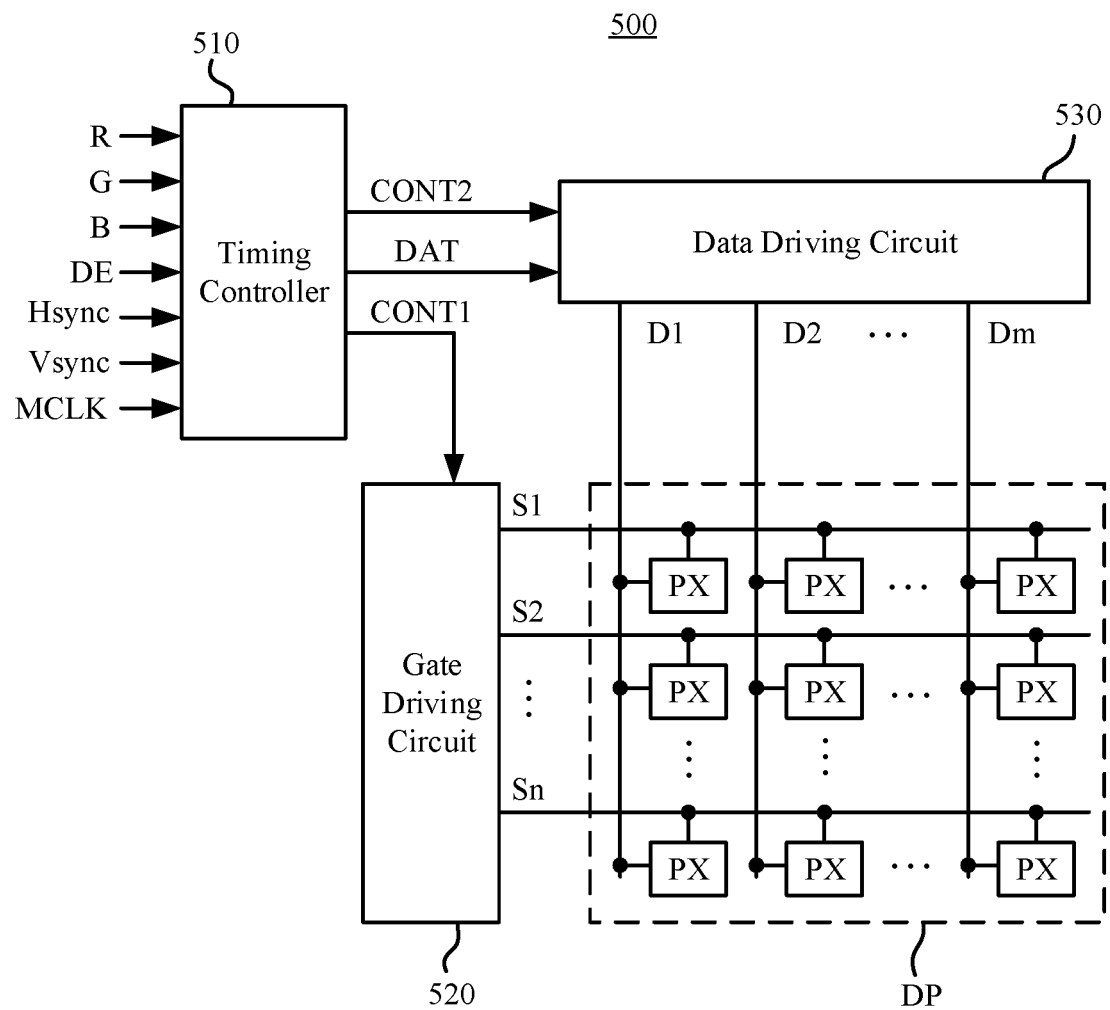
FIG. 5 is a schematic block diagram of a display device in accordance with an exemplary embodiment.

FIG. 5 is a schematic block diagram of a display device 500 in accordance with an exemplary embodiment. Referring to FIG. 5, the display device 500 includes a timing controller 510, a gate driving circuit 520, a data driving circuit 530, and a display panel DP.

The timing controller 510 receives synchronization signals and video signals R, and B from a system interface. The synchronization signals may include a horizontal synchronization signal Hsync, a vertical synchronization signal Vsync, a main clock signal MCLK, and a data enable signal DE. The video signals R, and B contain luminance information of each of a plurality of pixels PX. The timing controller 510 generates a first driving control signal CONT1, a second driving control signal CONT2, and image data signals DAT according to the video signals R, and B, the horizontal synchronization signal Hsync, the vertical synchronization signal Vsync, the data enable signal DE, and the main clock signal MCLK. The first driving control signal CONT1 may include a frame start signal STV, and first to fourth clock signals ck1 to ck4. The timing controller 510 divides the video signals R, and B into units of frames according to the vertical synchronization signal Vsync, and divides the video signals R, and B into units of data lines according to the horizontal synchronization signal Hsync to generate the image data signals DAT. The timing controller 510 transfers the image data signals DAT and the second driving control signal CONT2 to the data driving circuit 530.

The display panel DP includes the pixels PX arranged substantially in a matrix form. In the display panel DP, a plurality of substantially parallel scan lines S1 to Sn extend in a row direction, and a plurality of substantially parallel data lines D1 to Dm extend in a column direction. The scan lines S1 to Sn and the data lines D1 to Dm are coupled to the pixels PX.

The gate driving circuit 520 is coupled to the scan lines S1 to Sn, and generates a plurality of corresponding scan signals according to the first driving control signal CONT1. The gate driving circuit 520 sequentially applies these scan signals to the scan lines S1 to Sn. The gate drive circuit 520 may take the form of the gate drive circuit embodiments described above. In some exemplary embodiments, the gate drive circuit 520 is integrated into the display panel DP as a gate-driver-on-array (GOA) circuit. Alternatively, the gate driving circuit 520 may be connected to the display panel DP through a Tape Carrier Package (TCP).

The data driving circuit 530 is coupled to the data lines D1 to Dm. In response to the second driving control signal CONT2, the data driving circuit 530 converts the image data signals DAT into analog data voltages, and applies the converted analog data voltages to the data lines D1 to Dm, respectively. In some exemplary embodiments, the data drive circuit 530 may include a shift register, a latch, a digital-to-analog converter, and a buffer. The shift register can output a latch pulse to the latch. The latch can temporarily store the image data signals DAT, and can output the image data signals DAT to the digital-to-analog converter. The digital-to-analog converter converts the image data signals DAT into the analog data voltages, and outputs the converted analog data voltages to the buffer. The buffer outputs the analog data voltages to the data lines D1 to Dm.

Examples of the display panel DP include a liquid crystal display panel and an organic light emitting diode display panel. By way of example and not limitation, the display device 500 can be any product or component having display functionality, such as electronic paper, a cell phone, a tablet, a television, a display, a notebook computer, a digital photo frame, a navigator, and the like.

The display device 500 has the same advantages as those of the above shift register exemplary embodiments, and a detailed description thereof will not be repeated herein.

The foregoing is only specific exemplary embodiments of the present disclosure, but the scope of the present disclosure is not limited thereto. Any variations or substitutions that are readily conceivable to those skilled in the art are intended to be encompassed within the scope of the present disclosure. Therefore, the scope of protection of the present disclosure should be determined by the scope of the claims.

What is claimed is:

1. A shift register, comprising:
   a first clock signal terminal, a second clock signal terminal, a third clock signal terminal, a fourth clock signal terminal, a signal input terminal, a signal output terminal, and a first voltage terminal;
   an input circuit configured to transfer an input signal at the signal input terminal to a first node in response to a clock signal at the first clock signal terminal being active;
   an output circuit configured to store a voltage across the first node and the signal output terminal, and to transfer a clock signal at the second clock signal terminal to the signal output terminal in response to a potential at the first node being active;
   a first output control circuit configured to transfer a clock signal at the third clock signal terminal to the first node in response to the clock signal at the third clock signal terminal being active;
   a second output control circuit configured to transfer a voltage at the first voltage terminal to the first node in response to a clock signal at the fourth clock signal terminal being active;
   a reset circuit configured to transfer the voltage at the first voltage terminal to the signal output terminal in response to a potential at a second node being active;
   a first reset control circuit configured to transfer the voltage at the first voltage terminal to the second node in response to the potential at the first node being active;
   a second reset control circuit configured to transfer the clock signal at the fourth clock signal terminal to the second node in response to the clock signal at the fourth clock signal terminal being active; and
   an energy-storing circuit configured to store a voltage across the second node and the signal output terminal.

2. The shift register of claim 1, wherein the output circuit comprises:
   a sixth transistor comprising a gate connected to the first node, a first electrode connected to the second clock signal terminal, and a second electrode connected to the signal output terminal; and
   a first capacitor comprising a first terminal connected to the first node and a second terminal connected to the signal output terminal.

3. The shift register of claim 1, wherein the reset circuit comprises a seventh transistor comprising a gate connected to the second node, a first electrode connected to the first voltage terminal, and a second electrode connected to the signal output terminal.

4. The shift register of claim 3, wherein the energy-storing circuit comprises a second capacitor comprising a first terminal connected to the second node and a second terminal connected to the signal output terminal.

5. The shift register of claim 1, wherein the first output control circuit comprises a third transistor comprising a gate connected to the third clock signal terminal, a first electrode connected to the third clock signal terminal, and a second electrode connected to the first node.

6. The shift register of claim 5, wherein the second output control circuit comprises a fifth transistor comprising a gate connected to the fourth clock signal terminal, a first electrode connected to the first voltage terminal, and a second electrode connected to the first node.

7. The shift register of claim 1, wherein the first reset control circuit comprises a fourth transistor comprising a gate connected to the first node, a first electrode connected to the first voltage terminal, and a second electrode connected to the second node.

8. The shift register of claim 7, wherein the second reset control circuit comprises a second transistor comprising a gate connected to the fourth clock signal terminal, a first electrode connected to the fourth clock signal terminal, and a second electrode connected to the second node.

9. The shift register of claim 8, wherein the input circuit comprises a first transistor comprising a gate connected to the first clock signal terminal, a first electrode connected to the signal input terminal, and a second electrode connected to the first node.

10. A gate driving circuit, comprising:
    N shift registers of claim 1 that are cascaded, N being an integer greater than or equal to 4,
    wherein the signal input terminal of a first one of the N shift registers is configured to receive a start signal,
    wherein the signal output terminal of an n-th one of the N shift registers is connected to the signal input terminal of an (n+1)-th one of the N shift registers, n being an integer, $1 \leq n \leq N-1$,
    wherein the first clock signal terminal of a (4i+1)-th one of the N shift registers, the fourth clock signal terminal of a (4i+2)-th one of the N shift registers, the third clock signal terminal of a (4i+3)-th one of the N shift registers, and the second clock signal terminal of a (4i+4)-th one of the N shift registers are configured to receive a first clock signal, i being an integer, $0 \leq i \leq (N-4)/4$,
    wherein the second clock signal terminal of the (4i+1)-th one of the N shift registers, the first clock signal terminal of the (4i+2)-th one of the N shift registers, the fourth clock signal terminal of the (4i+3)-th one of the N shift registers, and the third clock signal terminal of the (4i+4)-th one of the N shift registers are configured to receive a second clock signal,
    wherein the third clock signal terminal of the (4i+1)-th one of the N shift registers, and the second clock signal terminal of the (4i+2)-th one of the N shift registers, the first clock signal terminal of the (4i+3)-th one of the N shift registers, and the fourth clock signal terminal of the (4i+4)-th one of the N shift registers are configured to receive a third clock signal, and wherein the fourth clock signal terminal of the (4i+1)-th one of the N shift registers, and the third clock signal terminal of the (4i+2)-th one of the N shift registers, the second clock signal terminal of the (4i+3)-th one of the N shift registers, and the first clock signal terminal of the (4i+4)-th one of the N shift registers are configured to receive a fourth clock signal terminal.

11. A display panel comprising the gate drive circuit of claim 10.

12. A display device comprising the display panel of claim 11.

13. A method of driving a shift register, wherein the shift register comprises: a first clock signal terminal, a second clock signal terminal, a third clock signal terminal, a fourth clock signal terminal, a signal input terminal, a signal output terminal, and a first voltage terminal; an input circuit configured to transfer an input signal at the signal input terminal to a first node in response to a clock signal at the first clock signal terminal being active; an output circuit configured to store a voltage across the first node and the signal output terminal, and to transfer a clock signal at the second clock signal terminal to the signal output terminal in response to a potential at the first node being active; a first output control circuit configured to transfer a clock signal at the third clock signal terminal to the first node in response to the clock signal at the third clock signal terminal being active; a second output control circuit configured to transfer a voltage at the first voltage terminal to the first node in response to a clock signal at the fourth clock signal terminal being active; a reset circuit configured to transfer the voltage at the first voltage terminal to the signal output terminal in response to a potential at a second node being active; a first reset control circuit configured to transfer the voltage at the first voltage terminal to the second node in response to the potential at the first node being active; a second reset control circuit configured to transfer the clock signal at the fourth clock signal terminal to the second node in response to the clock signal at the fourth clock signal terminal being active; and an energy-storing circuit configured to store a voltage across the second node and the signal output terminal, the method comprising:

responsive to the clock signal at the first clock signal terminal being active, transferring by the input circuit the input signal at the signal input terminal to the first node;

responsive to the potential at the first node being active, transferring by the output circuit the clock signal at the second clock signal terminal to the signal output terminal, and transferring by the first reset control circuit the voltage at the first voltage terminal to the second node;

responsive to the clock signal at the third clock signal terminal being active, transferring by the first output control circuit the clock signal at the third clock signal terminal to the first node;

responsive to the clock signal at the fourth clock signal terminal being active, transferring by the second reset control circuit the clock signal at the fourth clock signal terminal to the second node, and transferring by the second output control circuit the voltage at the first voltage terminal to the first node; and responsive to the potential at the second node being active, transferring by the reset circuit the voltage at the first voltage terminal to the signal output terminal.

14. The method of claim 13, further comprising:

supplying, to the first clock signal terminal, the second clock signal terminal, the third clock signal terminal, and the fourth clock signal terminal, a first clock signal, a second clock signal, a third clock signal, and a fourth clock signal, respectively, wherein the first, second, third, and fourth clock signals each have a period of 4H and a duty ratio of 25%, and wherein the first, second, third and fourth clock signals sequentially lag behind by 1H with respect to each other.

* * * * *